United States Patent [19]

Klersy et al.

[11] Patent Number: 5,330,630
[45] Date of Patent: Jul. 19, 1994

[54] SWITCH WITH IMPROVED THRESHOLD VOLTAGE

[75] Inventors: Patrick J. Klersy, Madison Heights; Stanford R. Ovshinsky, Bloomfield Hills, both of Mich.

[73] Assignee: Energy Conversion Devices, Inc., Mich.

[21] Appl. No.: 636,815

[22] Filed: Jan. 2, 1991

[51] Int. Cl.$^5$ .......................... C23C 14/34; B05D 3/06
[52] U.S. Cl. .......................... 204/192.25; 204/192.15; 427/570; 427/573; 427/575; 427/595
[58] Field of Search .......................... 427/38, 39, 76, 569, 427/573, 575, 570, 595, 597; 204/192.15, 192.17, 192.25, 192.26, 192.27

[56] References Cited

U.S. PATENT DOCUMENTS

| | | | |
|---|---|---|---|
| 3,945,935 | 3/1976 | Torp et al. | 204/192.26 X |
| 3,964,986 | 6/1976 | Mark | 204/192.26 |
| 4,205,098 | 5/1980 | Kobayashi et al. | 427/76 |
| 4,217,374 | 8/1980 | Ovshinsky et al. | 427/76 X |
| 4,231,808 | 11/1980 | Tabei et al. | 427/76 X |
| 4,352,834 | 10/1982 | Taketoshi et al. | 427/76 X |
| 4,386,142 | 5/1983 | Hodes et al. | 427/76 X |
| 4,508,608 | 4/1985 | Palmer | 204/192.15 |
| 4,804,490 | 2/1989 | Pryor et al. | 204/192.25 X |
| 4,842,973 | 6/1989 | Badesha et al. | 427/76 X |

Primary Examiner—Nam Nguyen
Attorney, Agent, or Firm—Marvin S. Siskind

[57] ABSTRACT

The first fire voltage of chalcogenide-based switching devices is lowered to a value approximately equal to the threshold voltage by treatment of the chalcogenide material with fluorine either during or after deposition.

18 Claims, 2 Drawing Sheets

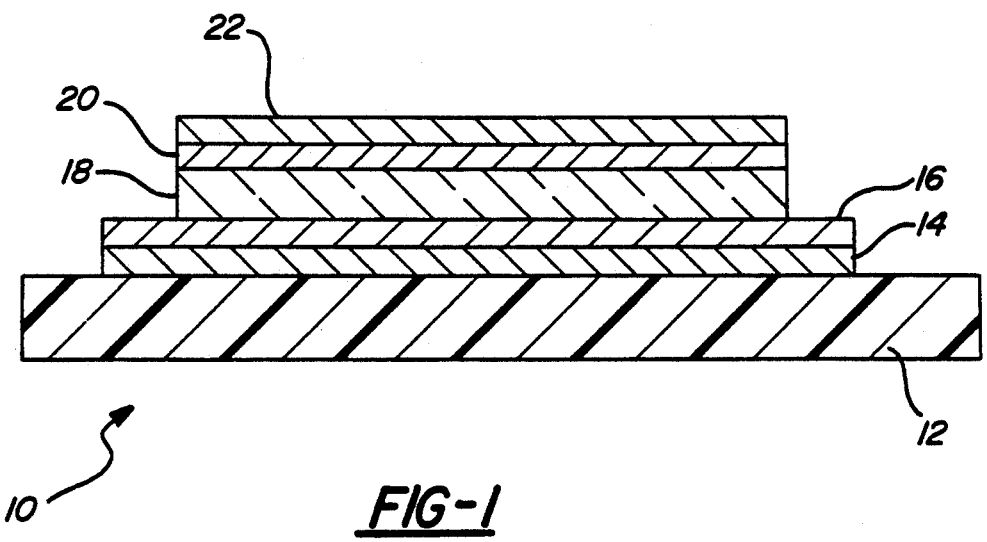
FIG-1
FIG-2
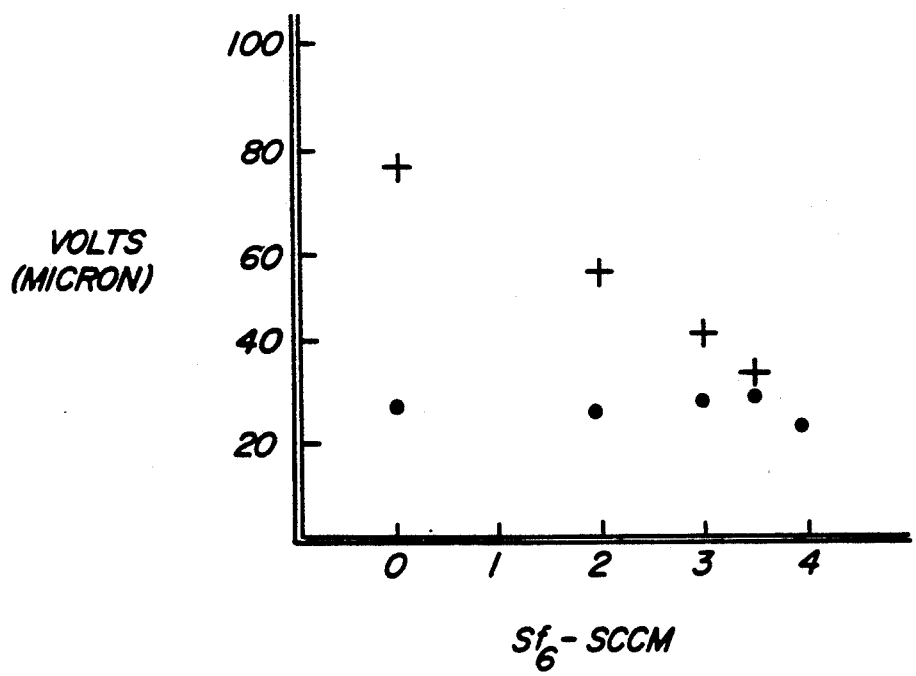

SWITCH WITH IMPROVED THRESHOLD VOLTAGE

FIELD OF THE INVENTION

The present invention relates to solid state threshold switches in general. More particularly, the invention relates to chalcogenide threshold switches having improved stability and a significantly reduced first fire voltage, and to methods and materials for their manufacture.

BACKGROUND OF THE INVENTION

Threshold switches are devices which change their electrical conductivity in response to a voltage applied thereacross. Ovonic threshold switches are solid state devices based upon materials and effects first discovered by S. R. Ovshinsky; see for example, "Reversible Electrical Switching Phenomena in Disordered Structures" Physical Review Letters, vol. 21, no. 20, Nov. 11, 1968, p. 1450(c). Ovonic threshold switching materials have bi-stable conductivity characteristics. In the absence of an applied threshold voltage, the materials are in a blocking state and exhibit a high electrical resistivity. Imposition of a voltage exceeding a specific threshold value causes the materials to switch to a low resistivity conductivity state, which is many orders of magnitude below the resistivity in the blocking state, and this state is maintained provided a minimum holding current flows therethrough; termination of the holding current cycles the material back to the high resistivity state. Ovonic threshold switching devices exhibit switching speeds of less than 150 pico seconds and have significant use as high-speed transient suppressors as well as in various other switching applications. The characteristics of these switches and the materials from which they are fabricated are disclosed in U.S. Pat. Nos. 3,271,591 and 3,343,034, the disclosures of which are incorporated herein by reference.

Threshold switching devices are generally constructed to include a body of switching material with at least a pair of electrodes operatively disposed on opposite sides thereof. Control of the characteristics of the switching material is achieved by compositional modification and/or modifications of the local order or other morphological modification of the switching material. The switching material is designed to have a threshold value and an electrical resistance suited for a particular application.

"First Fire Voltage" is the voltage which is needed to switch a freshly prepared threshold switching device from the high resistivity to the low resistivity state. This first fire voltage is typically much higher than the normal threshold voltage manifested by the switch after first fire. The initial voltage permits morphological relaxation of the material to occur and thereby restructures the local order of the material to a stable configuration. Once the forming operation has been carried out, the threshold switching voltage remains reproducible and constant.

In the case where discrete switches are being manufactured, the first fire voltage phenomenon generally presents at most only a minor problem since, in an initial stage in the testing of the devices, they are simply exposed to a high voltage pulse and consequently formed. However, it is often desirable to include threshold switches in array configurations or in combinations with other devices and under such circumstances, the first fire voltage phenomenon can present a significant problem. The higher voltage necessary to form the freshly manufactured threshold switches may be sufficiently large so as to damage other semiconductor devices connected thereto. Also, if an array of threshold switches is being first fired, the first switch in the array to achieve its working threshold will then serve to create a low resistivity current path which prevents the other switches from being properly formed. To overcome these problems, sophisticated isolation circuitry must be included in combination with the threshold switches. Another problem presented by the first fire phenomenon is tied into the fact that the final working threshold voltage of the switch is, to some degree, a function of the first fire voltage applied to the device and the first fire voltage required may vary from device to device. Consequently, individual switches in arrays of threshold switching devices may all manifest somewhat different working thresholds.

Clearly, problems occasioned by the first fire phenomenon cam complicate the use of threshold switching devices in cross-point switching arrays and the like and in conjunction with other types of devices. Therefore, it would be desirable to provide threshold switching devices which are free of the effects of this phenomenon. Heretofore, it has been known to treat chalcogenide threshold switching materials with activated hydrogen for purposes of stabilizing the working threshold of such devices; these techniques are disclosed in U.S. Pat. No. 4,804,490, the disclosure of which is incorporated herein by reference.

In accord with the principles of the present invention, it is now possible to provide threshold switches which include fluorinated switching materials having optimized short range order and which manifest very little, if any, first fire voltage effects. The present invention makes possible the widespread utilization of threshold switches in a variety of circuits and in a variety of electronic devices and makes possible the manufacture of switching arrays having uniform properties. These and other features and advantages of the present invention will be readily apparent from the drawings, discussion and description which follow.

BRIEF DESCRIPTION OF THE INVENTION

There is disclosed herein methods and materials for manufacturing threshold switching devices having a lowered first fire threshold. Also disclosed are improved switching devices. The switching device is generally of the type comprising a body of chalcogenide material disposed between two electrodes.

The method includes the steps of vacuum depositing a chalcogenide material and exposing the chalcogenide material to an atmosphere including fluorine therein. The chalcogenide material may be exposed to the fluorine while it is being vacuum deposited or it may first be deposited and subsequently exposed to the fluorine containing atmosphere.

The steps of vacuum depositing the chalcogenide material include techniques such as sputtering, glow discharge decomposition and the like. The fluorine containing atmosphere may be generated from free fluorine, or from a fluorine-containing material such as sulphur hexafluoride, carbon tetrafluoride, germanium tetrafluoride or the fluorides of arsenic, tellurium or selenium. While fluorine is a "super-halogen" which is highly reactive in its ground state the atmosphere may be further activated or energized, for example, by radio frequency energy, direct current energy, microwave energy or by photochemical or thermal excitation of a fluorine-containing atmosphere. The instant invention further includes switching devices of the type which include a body of material comprising tellurium, germanium, sulfur, arsenic, selenium and fluorine. The materials prepared according to the process of the present invention will preferably include up to 10 atomic percent fluorine incorporated therein.

BRIEF DESCRIPTION OF THE DRAWINGS

FIG. 1 is a cross-sectional view of a chalcogenide switching device of the type which may be advantageously prepared according to the present invention;

FIG. 2 is a graphic representation of the first fire voltage and threshold voltage of a series of chalcogenide switches prepared in accordance with the present invention, plotted as a function of increasing $SF_6$ concentrations in the deposition atmosphere;

DETAILED DESCRIPTION OF THE INVENTION

Figure 3:
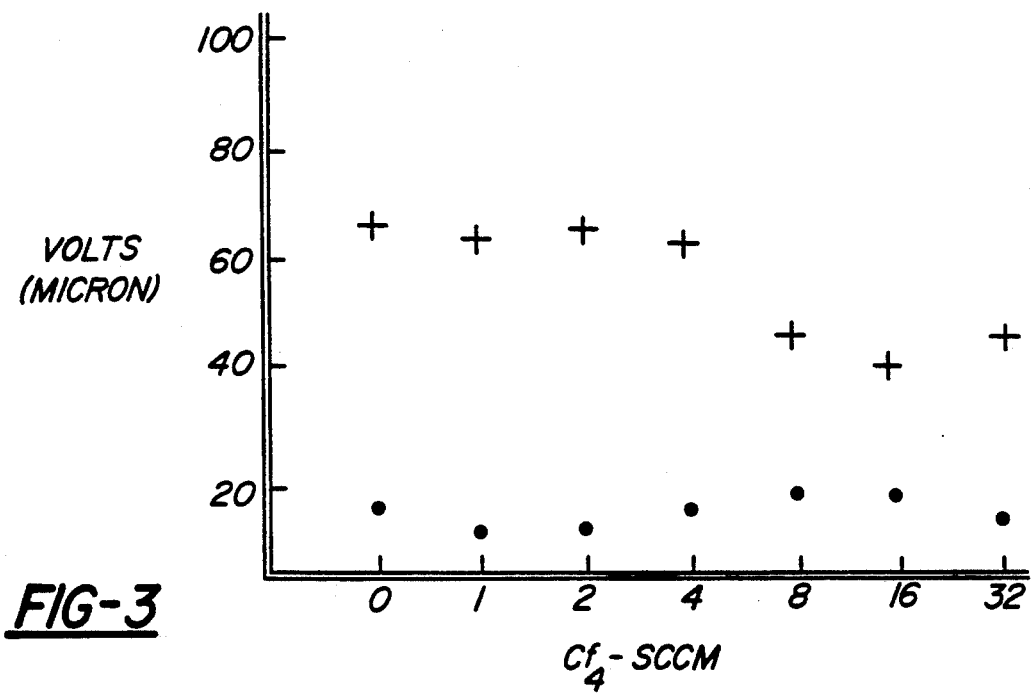
FIG. 3 is a graphic representation of first fire and threshold voltages for a series of switches prepared in accordance with the present invention, plotted as a function of increasing $CF_4$ concentration in the deposition atmosphere.
Figure 4:
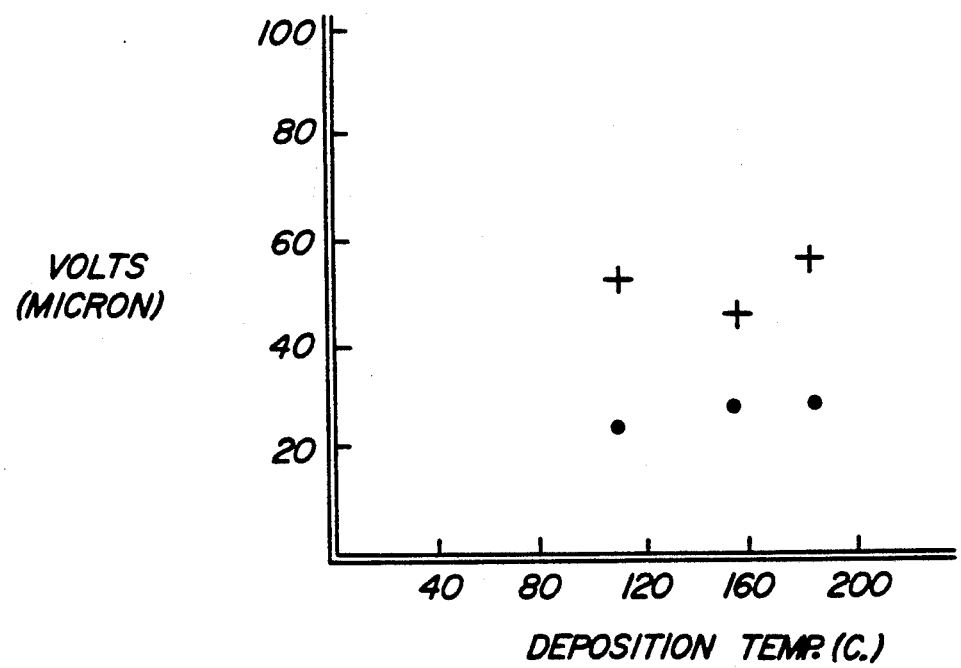
FIG. 4 is a graphic representation of first fire voltage and threshold voltage for a series of chalcogenide switches prepared in accordance with the present invention, plotted as a function of increasing substrate temperatures.

The present invention significantly lowers the first fire voltage of chalcogenide-based switching devices to values which approximate the threshold switching voltage of such devices. As such, the present invention eliminates problems which have heretofore made difficult the use of such devices, particularly in large scale arrays such as cross-point switching arrays. The present invention may be employed with a variety of chalcogenide-based switching materials and a variety of switch configurations. It is to be understood that within the context of the present invention, "chalcogenide materials" or "chalcogenide-based materials" are meant to include those materials which have one or more group VIa elements therein. Typically these materials will include elements from groups IV, V and VI and, in accord with the present invention, may also include some fluorine incorporated therein. A typical chalcogenide switching material of the present invention will include tellurium, germanium, sulphur, arsenic, selenium, fluorine and possibly some silicon therein.

There are a variety of switch configurations which have been implemented utilizing chalcogenide materials. In the most basic form, such switches include a pair of electrodes in electrical communication with a body of chalcogenide material. The device may be fabricated in a thin film configuration having electrodes disposed on a common substrate in a coplanar, spaced apart relationship with a body of chalcogenide material overlying them. In other instances, the switching device may comprise a stacked, thin film device wherein a body of chalcogenide material is sandwiched between a pair of electrodes. In yet other embodiments, the chalcogenide switching device may comprise a bulk device wherein a relatively large pair of electrodes, such as a pair of carbon buttons, are separated by a chalcogenide body.

Referring now to FIG. 1, there is shown a typical, solid state, high-current-carrying threshold switching device 10 of the type which may be beneficially fabricated in accord with the present invention. The switching device 10 of FIG. 1 includes a substrate 12 which may be an electrically conductive body such as a sheet of metal or a silicon wafer, or it may be an electrically insulating body such as a sheet of glass or polymer resin and is preferably of relatively high thermal conductivity.

Deposited atop the substrate 12 is a layer of bottom electrode material 14 which, in one preferred embodiment, comprises a thin film of molybdenum, it being understood that other conductive materials may be similarly employed. The molybdenum electrode in this embodiment is approximately 5,000 Angstroms thick although the precise thickness of the electrode will be determined by the current carrying capacity of the switch. Immediately atop the layer of bottom electrode material 14 is a body of carbon 16. It has been found, in accordance with the present invention, that inclusion of a carbon layer eliminates contact effects which can interfere with switching of the chalcogenide material. The carbon layer 16 typically has a thickness in excess of 100 Angstroms and generally falls in the range of 1,000-5,000 Angstroms in thickness. In the depicted embodiment, the carbon layer 16 is 4,000 Angstroms thick.

The layer of thin film chalcogenide switching material 18 is disposed atop the carbon layer 16 of the bottom electrode. The chalcogenide material is the active switching element of the device 10 of FIG. 1 and is deposited by a vacuum deposition process in accord with the principles of the present invention. In the context of this invention, vacuum deposition processes include sputtering, vacuum evaporation, plasma glow discharge deposition, and ion or molecular beam techniques. The thickness of the chalcogenide material 18 should be sufficient to provide a continuous cover over the carbon electrode material 16. While there is no minimum thickness for the layer, it has been noted that new electronic behaviors are manifested in switching layers of less than 100 Angstroms thickness. The switching threshold of the device will depend upon the composition of the chalcogenide material 18 as well as its thickness hence, the desired working threshold will govern the thickness of the chalcogenide layer 18. In general, the chalcogenide layer 18 has a thickness of less than 50,000 Angstroms. In the illustrated embodiment, the switching threshold of the chalcogenide material employed is typically on the order of 30 volts per micron of conduction path length and the chalcogenide layer 18 is in the range of 5,000-6,000 Angstroms in thickness and the switching threshold is approximately 15-18 volts. As mentioned hereinabove, the present invention may be employed in conjunction with the deposition of a wide range of chalcogenide alloys. One particular alloy having significant commercial utility is an alloy comprised of $Te_{36}$, $Ge_{23}$, $S_{21}$, $As_{18}$, $Se_2$. This alloy may also include up to 10 atomic percent of fluorine and may further include silicon.

The device is completed by a top electrode pair disposed atop the chalcogenide body. The top electrode pair includes a second carbon layer 20 generally similar to the carbon layer 16 described hereinabove and a top metallic layer 22 generally similar to the bottom metallic layer 14. In further embodiments, the various layers are subsequently encapsulated by a protective, electrically insulating material such as a layer of an inorganic oxide or nitride, or a layer of polymeric material. The insulating material has access vias therethrough communicating with the top and bottom electrodes of the device to facilitate contact thereto.

The principles of the present invention will be illustrated by a series of examples which follow. The examples detail the fabrication and testing of a number of switching devices generally similar to that of FIG. 1.

EXAMPLE 1

In this series of examples, the chalcogenide switching bodies of a number of threshold switches were exposed to increasing concentrations of activated fluorine during their fabrication and the results are illustrated in FIG. 2.

A number of chalcogenide switches generally similar to that of FIG. 1 were prepared. The devices were prepared upon glass substrates and in general, the various layers of the switching device were deposited in sequence while the substrate was continuously maintained under a partial vacuum. This helps to ensure that extremely clean interfaces are formed between the layers and greatly reduces the chance for any appreciable amount of contamination by air, water vapor, dust or the like. By so doing, the physical integrity of the interfaces is assured. Such clean interfaces are believed to greatly reduce possible localized heating effects and nucleation sites for undesired local crystallization of the semiconductor materials, which may well adversely affect the electrical stability of the device.

After chemical cleaning, the substrate is disposed in a vacuum chamber and a lower molybdenum electrode of approximately 5,000 Angstroms is deposited thereupon by a conventional sputtering process utilizing an argon atmosphere of approximately 4.5 milli-torr pressure and an applied D.C. power of approximately 3 watts per cm$^2$. After deposition of the molybdenum layer, a carbon layer of approximately 4,000 Angstroms thickness was sputtered thereupon under similar conditions and at a total power of 10 watts/cm$^2$.

After the bottom electrode layers are in place, a body of chalcogenide material of approximately 5,100 Angstroms is then deposited atop the carbon. The starting chalcogenide material in this example comprises Te$_{36}$, Ge$_{23}$, S$_{21}$, As$_{18}$, Se$_2$ and is referred to herein as a 0027 alloy. The chalcogenide material is formed into a sputtering cathode of approximately 3 inches in diameter. The power applied to the cathode is approximately 42 watts at a frequency of 13.45 MHz. The sputtering process is carried out in a background atmosphere of argon maintained at a pressure of approximately 4.0 milli-torr. In the present experimental series, increasing concentrations of SF$_6$ were added to the atmosphere used for the deposition of the chalcogenide.

Following deposition of the chalcogenide material, a top carbon and molybdenum electrode were deposited. The top carbon electrode was also 4,000 Angstroms thick and the top molybdenum electrode was 2,100 Angstroms thick. Throughout the depositions, the substrate was maintained at an elevated temperature as will be detailed hereinbelow. It is to be understood that upon deposition of all the layers, the coated substrate may be advantageously patterned by conventional photolithographic techniques so as to create a plurality of discrete devices.

FIG. 2 summarizes the results of the foregoing experimental series. The graph depicts both first fire voltage, shown by the crosses and threshold voltage after first fire, shown by the dots. The voltages are all normalized to volts per micron of current path and are plotted against increasing concentrations of SF$_6$ in the chalcogenide deposition atmosphere. It will be noted that the control samples including no fluorine-containing gas in the deposition atmosphere manifested first fire and threshold voltages were approximately 80 and 30 volts per micron, respectively. This is consistent with the behavior of prior art devices. When the background gas included 2 sccm of SF$_6$, the first fire voltage dropped to approximately 60 volts per micron while the threshold voltage remained at approximately 30 volts per micron. Increasing the amount of SF$_6$ to 3 sccm further decreased the first fire voltage to approximately 40 volts per micron while the threshold voltage remained at approximately 30 volts per micron. A further increase of SF$_6$ to approximately 3.5 sccm resulted in a first fire voltage and threshold voltage which were both approximately 35 volts per micron. A further increase in SF$_6$ to 4 sccm produced a device which was initially shunted, i.e., it was in a high conductivity state, but subsequently manifested a threshold of approximately 28 volts per micron.

It is to be noted that the substrate was maintained at a temperature of approximately 165° C. for the deposition of the material including no SF$_6$ and at 185° C. for the subsequent depositions. Analysis of the chalcogenide material revealed that approximately 3–4 atomic percent of fluorine was incorporated into the films. The analysis also indicated that there was some slight depletion of germanium and enrichment of tellurium for materials deposited in the fluorine-containing atmosphere. A specific analysis of the sample prepared with 3.5 sccm of SF$_6$ gave a specific composition of Te$_{33.18}$ Ge$_{7.38}$S$_{26.6}$ As$_{29.57}$ Se$_{1.3}$ and F$_{3.27}$. In order to assess whether the improvement in first fire voltage was attributable to a mere shift in composition, a series of switches were prepared by a sputtering process as in the foregoing example, but employing a fluorine-free atmosphere and a cathode having the composition of: Te$_{35.7}$ Ge$_{6.6}$S$_{27.4}$ As$_{28.94}$ and Se$_{1.3}$. A first series of devices deposited on a substrate maintained at 180° C. included a 0.65 micron thick layer of chalcogenide material and were all shunted as prepared. A second series was deposited on substrates maintained at room temperature and included a 0.70 micron thick layer of chalcogenide material. These switches had a first fire voltage of 41 volts and a threshold of 16 volts, normalized to 1 micron thickness. The results attendant upon the use of fluorine are attributable, at least in large part to the action of fluorine in optimizing the morphology of the deposited chalcogenide film. It is further speculated that fluorine acts to configure and/or reconfigure the bonds between the components of the chalcogenide film so as to achieve the lowest free energy of states thereof and to provide a morphology optimized for switching. By so doing, the implementation of a separate forming stage is eliminated.

EXAMPLE 2

In this experimental series, a number of threshold switching devices were prepared which were generally similar to those in the previous example; however, carbon tetrafluoride, CF$_4$, was used as a source of fluorine. Also, the carbon electrode layers were 1,000 Angstroms thick in this series and the upper molybdenum layer was 2,100 Angstroms thick. The chalcogenide material was similar to that of the previous experimental series and ranged in thickness from 5,300–6,400 Angstroms. Substrate temperatures were 185° C.

It will be noted from the graph of FIG. 3 that the first fire voltage is approximately 70 volts and the threshold voltage is approximately 15 volts per micron for material deposited in the absence of any fluorine. When the amount of $CF_4$ is increased to approximately 16 sccm the first fire voltage drops to approximately 40 and the threshold voltage rises to approximately 20.

EXAMPLE 3

In the third series of example, the effective substrate temperature was ascertained. Again, a series of devices generally similar to that of FIG. 1 was prepared in accordance with the procedure outlined for example 1. The layer thicknesses were approximately equal to those of example 1 and depositions were carried out at various substrate temperatures. It is to be noted herein that the substrate temperatures specified herein are nominal substrate temperatures. Substrate heating was accomplished by an infrared heater disposed proximate, but spaced from, the substrate. Temperature is measured by a thermocouple placed close to the substrate and there may be some deviation between actual substrate temperature reading and thermocouple readings.

In the experimental series, the $SF_6$ was present in the atmosphere at approximately 2 sccm. It will be noted that the first fire voltage and the threshold voltage come closer together as a nominal substrate temperature of 160° C. is achieved.

It is has also been found in accord with the principles of the present invention that fluorine-containing gases other than $SF_6$ and $CF_4$ may be similarly employed. For example, elemental fluorine may be advantageously employed in the present invention; however, fluorine is a somewhat difficult material to handle and accurately meter. Hence fluorine-containing gases are more generally preferred. $SF_6$ is particularly preferred since the material being deposited does include some sulfur and hence any residues from the gas will not present significant contamination problems. Similarly, $CF_4$ is preferred since any possible carbon inclusions will not adversely affect the switching characteristics of the chalcogenide materials. Other non-interfering, fluorine-containing materials such as $NF_3$, $GeF_4$, $GF_3$, $TeF_4$, $TeF_6$, $SeF_4$, $SeF_6$ and $AsF_5$ may be similarly employed.

While the foregoing examples have described the process of the present invention as being implemented concomitant with the sputtering of a body of chalcogenide material, it is to be appreciated that the invention may be practiced in other manners. For example, chalcogenide materials are often deposited by a process of evaporation wherein a heated body of material is evaporated in a vacuum and condensed upon a substrate. In accord with the present invention, evaporation may take place in an atmosphere containing fluorine therein and such a process also obtains the advantages of the present invention. In other instances, semiconductor material such as chalcogenide materials may be prepared by a plasma glow discharge deposition process wherein semiconductor-containing feedstock gases are subjected to electrical energy in the form of a DC, radio frequency or microwave field which ionizes the gases and causes deposition of a semiconductor material. Again, inclusion of fluorine or fluorine-containing gases in the atmosphere will lower the first fire threshold material.

The chalcogenide material may be treated with fluorine species either concomitant with its deposition or in a separate process, in which instance the deposited body of semiconductor material will be exposed to fluorine either by "soaking" in a fluorine atmosphere, ion impingement in a plasma, ion implantation, or other similar treatment. Ion implantation is carried out by bombarding a deposited chalcogenide layer with fluorine ions accelerated to the KeV energy range. As is well known in the art, ion implanted samples are typically annealed after impingement. In the present situation, annealing is carried out near, but below, the glass transition temperature of the chalcogenide. A typical annealing temperature is in the range of 200°–300° C. Annealing is usually carried out for times up to two hours. While fluorine is a highly reactive material, further activation of the fluorine-containing gas may also be accomplished by input of electrical energy as noted hereinabove or by input of photon energy in the form of visible, ultraviolet or x-radiation, or by the input of thermal energy.

In view of the foregoing, it is clear that the present invention may be implemented in connection with a variety of vacuum deposition processes and through the use of a number of fluorine containing species. The foregoing drawings, discussion, description and examples are merely illustrative of particular embodiments of the present invention and are not limitations thereupon. It is the following claims, including all equivalents which define the present invention.

We claim:

1. A method of manufacturing an improved threshold switching device, said device comprising a body of chalcogenide threshold switching material disposed between two electrodes, said method including the steps of:

vacuum depositing a body of chalcogenide threshold switching material, said chalcogenide material being characterized by an initial first fire threshold voltage; and exposing said body of chalcogenide threshold switching material to an atmosphere including fluorine therein, thereby reducing the first fire threshold voltage to a value substantially lower than the initial value.

2. A method as in claim 1, wherein the step of exposing said chalcogenide material to an atmosphere including fluorine, comprises exposing said chalcogenide material while it is being vacuum deposited.

3. A method as in claim 1, wherein the step of exposing said chalcogenide material to an atmosphere including fluorine comprises exposing said chalcogenide material after it is vacuum deposited.

4. A method as in claim 1, wherein the step of vacuum depositing said chalcogenide material comprises sputtering said chalcogenide material.

5. A method as in claim 1, wherein the step of vacuum depositing said chalcogenide material comprises evaporating said chalcogenide material.

6. A method as in claim 1, wherein the step of vacuum depositing said chalcogenide material comprises the steps of:

providing a gaseous atmosphere including at least one precursor species of said chalcogenide material and energizing said gaseous atmosphere so as to create a plasma therefrom.

7. A method as in claim 1, wherein the step of exposing said chalcogenide material to an atmosphere including fluorine therein comprises the steps of:
 providing an atmosphere including a gaseous member selected from the group consisting of a fluorocarbon, sulfur hexafluoride, fluorine, germanium tetrafluoride, nitrogen trifluoride and combinations thereof; and
 energizing said gaseous atmosphere so as to provide the fluorine.

8. A method as in claim 7, wherein the step of energizing the gaseous atmosphere comprises providing radio frequency energy to the gaseous atmosphere.

9. A method as in claim 7, wherein the step of energizing the gaseous atmosphere comprises providing DC energy to the gaseous atmosphere.

10. A method as in claim 7, wherein the step of energizing the gaseous atmosphere comprises providing microwave energy to the atmosphere.

11. A method as in claim 1, including the further steps of:
 providing a substrate having at least one of said electrodes supported thereupon and wherein the step of vacuum depositing said chalcogenide material comprises depositing said chalcogenide material on said substrate in electrical contact with said at least one electrode.

12. A method as in claim 11, including the further step of maintaining said substrate at a temperature above ambient.

13. A method as in claim 12, wherein the step of maintaining said substrate at a temperature above ambient comprises maintaining said substrate at a temperature within the range of 150°–200° C.

14. A method as in claim 1, wherein the step of vacuum depositing said body of chalcogenide material comprises vacuum depositing a material consisting essentially of Te, Ge, S, As, Se, and F.

15. A method as in claim 1, wherein the step of vacuum depositing said chalcogenide material includes the step of vacuum depositing a chalcogenide material comprising $Te_{36}$, $Ge_{23}$, $S_{21}$, $As_{18}$, $Se_2$ and 1–10 atomic percent F.

16. A method as in claim 1, wherein the step of exposing said chalcogenide material to an atmosphere including fluorine comprises subjecting said chalcogenide material to a plasma containing fluorine ions and subsequently annealing said chalcogenide material at an elevated temperature.

17. A method as in claim 1, wherein the step of exposing said chalcogenide material to fluorine comprises the steps of:
 providing a beam of fluorine ions;
 directing said beam onto said body of chalcogenide material; and
 annealing said body of chalcogenide material at an elevated temperature.

18. A method of manufacturing a threshold switching device having a lowered first fire threshold, said method including the steps of:
 providing a substrate;
 providing a first electrode on said substrate;
 disposing said substrate in a vacuum deposition chamber;
 providing a sputtering cathode in said chamber, said cathode comprising a chalcogenide material;
 maintaining said chamber at a subatmospheric pressure;
 introducing a fluorine containing working gas into said chamber, while maintaining said chamber at a pressure below atmospheric;
 energizing said cathode whereby chalcogenide material is sputtered from the cathode and deposited onto the substrate so as to provide a body of chalcogenide material in electrical contact with said first electrode; and
 providing a second electrode in electrical communication with said body of chalcogenide material.

* * * * *